United States Patent
Endo

(10) Patent No.: US 8,766,407 B2
(45) Date of Patent: Jul. 1, 2014

(54) SEMICONDUCTOR WAFER AND LAMINATE STRUCTURE INCLUDING THE SAME

(75) Inventor: Mitsuyoshi Endo, Yamato (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/365,516

(22) Filed: Feb. 3, 2012

(65) Prior Publication Data

US 2013/0049210 A1    Feb. 28, 2013

(30) Foreign Application Priority Data

Aug. 31, 2011  (JP) ................. 2011-189390

(51) Int. Cl.
*H01L 29/06*  (2006.01)
(52) U.S. Cl.
USPC ................. 257/618; 257/E23.179
(58) Field of Classification Search
None
See application file for complete search history.

(56) References Cited

U.S. PATENT DOCUMENTS

| 8,324,715 | B2 | 12/2012 | Endo |  |
|---|---|---|---|---|
| 2011/0304003 | A1* | 12/2011 | Tanida et al. | 257/447 |
| 2012/0248579 | A1 | 10/2012 | Endo |  |

FOREIGN PATENT DOCUMENTS

| JP | 5-226305 | 9/1993 |
| JP | 11-251277 | 9/1999 |
| JP | 2012-174937 A | 9/2012 |

OTHER PUBLICATIONS

Office Action issued Jan. 31, 2014, in Japanese Application No. 2011-189390 filed Aug. 31, 2011 (with English-language Translation).

* cited by examiner

*Primary Examiner* — Michael Lebentritt
*Assistant Examiner* — Kevin Quinto
(74) *Attorney, Agent, or Firm* — Oblon, Spivak, McClelland, Maier & Neustadt, L.L.P.

(57) ABSTRACT

According to one embodiment, a semiconductor wafer includes a semiconductor substrate and an interconnect layer formed on the semiconductor substrate. In the semiconductor wafer, the semiconductor substrate includes a first region that is located on the outer periphery side of the semiconductor substrate and that is not covered with the interconnect layer. The interconnect layer includes a second region where the upper surface of the interconnect layer is substantially flat. A first insulating film is formed in the first region. The upper surface of the interconnect layer within the second region and the upper surface of the first insulating film substantially flush with each other.

13 Claims, 8 Drawing Sheets

SEMICONDUCTOR WAFER AND LAMINATE STRUCTURE INCLUDING THE SAME

CROSS-REFERENCE TO RELATED APPLICATION

This application is based upon and claims the benefit of priority from prior Japanese Patent Application No. 2011-189390, filed on Aug. 31, 2011, the entire contents of which are incorporated herein by reference.

FIELD

Embodiments of the present invention relate to a semiconductor wafer and a laminate structure including the semiconductor wafer.

BACKGROUND

Recently, as a method of obtaining a semiconductor module having a three-dimensional multilayered structure, a technique has been studied which joins individual semiconductor chips divided from each other to laminate the semiconductor chips. However, in order to reduce a cost for lamination, another method is also being studied in which a plurality of semiconductor wafers are joined first before being divided into semiconductor chips, and then the structure resulting from the joining is divided into individual semiconductor chips.

Moreover, examples of the method of joining semiconductor wafers include a direct bonding method which uses a technique of hydroxyl bond or plasma activation and is carried out at the room temperature, a resin bonding method which uses a resin material, and the like.

DETAILED DESCRIPTION

In one embodiment, a semiconductor wafer includes a semiconductor substrate and an interconnect layer formed on the semiconductor substrate. The semiconductor substrate includes a first region which is located in an outer periphery portion of the semiconductor substrate and which is not covered with the interconnect layer. The interconnect layer includes a second region in which the upper surface of the interconnect layer is substantially flat. A first insulating film is formed in the first region. The upper surface of the interconnect layer within the second region and the upper surface of the first insulating film substantially flush with each other.

Hereinafter, exemplary embodiments are described with reference to the accompanying drawings, but the invention is not construed to be limited to the exemplary embodiments. Like portions through all drawings are denoted by like reference symbols and thus a redundant description will not be made. The drawings are schematic diagrams for helping better description and understanding of the invention, and thus the shape, scale, ratio, and the like may partially differ from those of an actual device. These may be appropriately designed or changed based on the description given below and known related arts.

Figure 1:
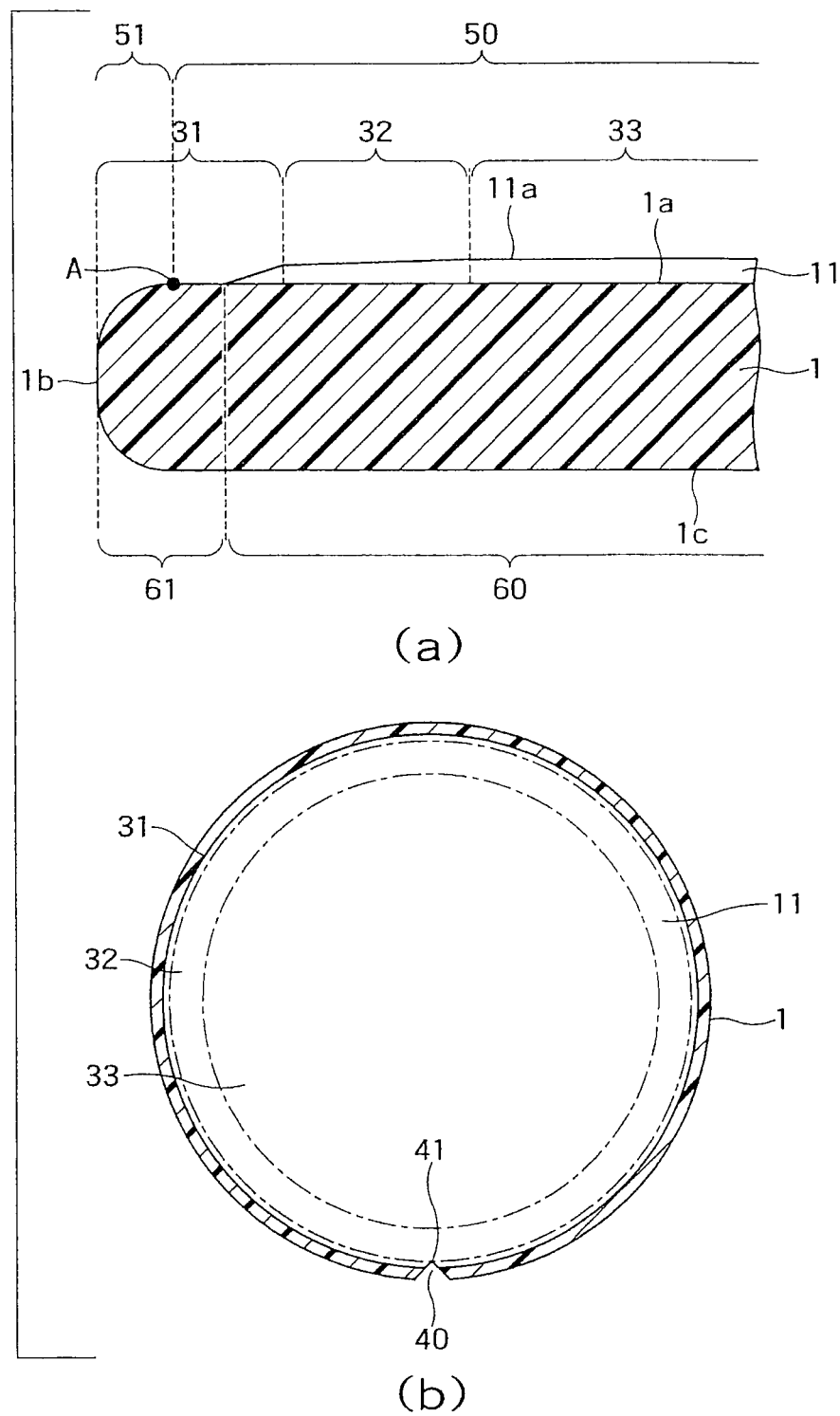
FIGS. 1 to 6 are diagrams for describing a method of manufacturing a semiconductor device according to an embodiment.

A semiconductor wafer 1 is described first. To be specific, an interconnect layer 11 is formed on the semiconductor wafer 1. Respective individual regions of the semiconductor wafer 1 which have not yet been joined with a counter wafer 2 (a wafer to be joined with the wafer 1) are described next with reference to FIGS. 1 (a) and 1 (b) which illustrate an example of the semiconductor wafer 1. FIG. 1 (a) is a cross-sectional view illustrating a portion of the semiconductor wafer 1 on the side of an outer periphery portion of the semiconductor wafer 1, and FIG. 1 (b) is a top view of the semiconductor wafer 1.

As illustrated in the cross-sectional view of FIG. 1 (a), in a center portion 50 of the semiconductor wafer 1 which ranges from the center of the semiconductor wafer 1 to around the outer periphery portion 51, the upper surface 1a of the semiconductor wafer 1 is substantially flat and its heights are substantially equal. Here, the expression "substantially equal" means not only a case where the heights measured from the back surface of the semiconductor wafer 1 are the same in terms of mathematics but also includes a case where there is a variation in height within a range that is allowed for manufacturing processes of the semiconductor wafer 1 in industries. Moreover, regarding the upper surface 1a of the semiconductor wafer 1 in the outer periphery portion 51, the upper surface 1a has a flat portion ending at a position in the outer periphery portion 51. The upper surface 1a curves toward the outside of the semiconductor wafer 1 from the position A in the drawing and its height decreases gradually. The upper surface 1a continues so as to connect to a side surface 1b of the semiconductor wafer 1.

Moreover, the interconnect layer 11 including a metal portion and an insulator portion is formed on the upper surface 1a of a portion of the center portion 50 of the semiconductor wafer 1. Specifically, the interconnect layer 11 includes an insulating film and an interconnect formed in the insulating film. Hereinafter, a portion of the upper surface 1a of the semiconductor wafer 1 where the interconnect layer 11 is formed is referred to as a fourth region 60. A portion of the upper surface 1a of the semiconductor wafer 1 where the interconnect layer 11 is not formed is referred to as a first region 61. Sometimes the interconnect layer 11 may be formed in the first region 61. However, the interconnect layer 11 formed in the first region 61 is an incomplete interconnect layer. Accordingly, in the description below, the interconnect layer 11 formed within the first region 61 is not treated as the interconnect layer 11, that is, the interconnect layer 11 within the first region 61 is assumed to be absent.

Of the upper surface 1a of the semiconductor wafer 1 on the side of the outer periphery portion 51 of the semiconductor wafer 1 and the upper surface 1a of the semiconductor wafer 1 on the side of the center portion 50 of the semiconductor wafer 1, the upper surface 1a on the side of the outer periphery portion 51 is a region where semiconductor elements should not be formed or a region where semiconductor elements are not formed. In the description below, this region is called an edge cut region 31. Specifically, in forming a resist film covering the interconnect layer 11 for the etching process of the interconnect layer 11, an edge cut process of getting rid of an outer periphery portion of the resist film is performed so as to prevent the resist film from spattering on the side surface 1b and the back surface 1c of the semiconductor wafer 1. For such a reason, a resist film does not cover the interconnect layer 11 formed within the outer periphery portion 51 and within a portion of the center portion 50 of the semiconductor wafer 1 which is near the outer periphery portion 51, so that the interconnect layer 11 formed within the outer periphery portion 51 and within the portion of the center portion 50 of the semiconductor wafer 1 which is near the outer periphery portion 51 is etched away. Accordingly, this region includes the edge cut region 31 in which semiconductor elements cannot be formed or semiconductor elements are not formed.

Regarding the thickness of the interconnect layer 11 on the semiconductor wafer 1, it is substantially constant at a middle portion of the center portion 50 of the semiconductor wafer 1. In other words, the heights of the upper surface 11a of the interconnect layer 11 on the semiconductor wafer 1 is substantially equal in the middle portion of the center portion 50 of the semiconductor wafer 1. Here, as mentioned above, the expression "substantially equal" means not only a case where the heights measured from the upper surface 1a of the semiconductor wafer 1 are the same in terms of mathematics but also includes a case where there is a variation in height within a range that is allowed for manufacturing processes of semiconductor wafers 1 in industries. In the description below, a region where the thickness of the interconnect layer 11 is substantially constant and the upper surface of the interconnect layer 11 is substantially flat is referred to as an interconnect layer constant-thickness region (second region) 33. When viewing between the interconnect layer constant-thickness region 33 and the edge cut region 31, there is a region which starts from an end of the interconnect layer constant-thickness region 33 and reaches an end of the edge cut region 31 (extending toward the periphery portion of the semiconductor wafer 1 from the interconnect layer constant-thickness region 33). In this region the thickness of the interconnect layer 11 gradually decreases, that is, the upper surface 11a of the interconnect layer 11 is gradually lowered in height. In the description below, this region is referred to as an interconnect layer gradual thickness decreasing region (third region) 32.

This interconnect layer gradual thickness decreasing region 32 is formed due to the flowing phenomenon. That is, when a process of forming the interconnect layer 11 on the semiconductor wafer 1 is performed, a polishing process called Chemical Mechanical Polishing (CMP) in which the upper surface 11a of the interconnect layer 11 is polished is performed. During the CMP, polishing undercut (a phenomenon in which the polished surface has a tapered portion) occurs, which is the cause of the interconnect layer gradual thickness decreasing region 32. That is, the thickness of the interconnect layer 11 gradually decreases over a way starting from the interconnect layer constant-thickness region 33 and reaching the edge cut region 31. However, the degree of gradual decrease is very small, that is, it is in the order of nanometers. Therefore, it is allowed that semiconductor elements and/or interconnects are formed in the interconnect layer thickness-decreasing region 32.

Moreover, as illustrated in FIG. 1 (b), the semiconductor wafer 1 of a substantially circular shape has a notch 40 (a cut out portion at a lower end of the semiconductor wafer 1 in FIG. 1 (b)), and moreover the interconnect layer 11 of a substantially circular shape is formed on the semiconductor wafer 1, within the center portion 50 except for an outer periphery portion of the center portion 50 of the semiconductor wafer 1 so that the interconnect layer 11 overlaps a portion of the notch 40. The edge cut region 31 is configured to include the innermost portion of the notch 40 (hereinafter, the tip of a cut out portion is referred to as the tip 41 of the notch 40) therein.

In the description above, an example in which the semiconductor wafer 1 has the notch 40 is described. However, the semiconductor wafer 1 may have an orientation flat instead of the notch 40. The orientation flat is a linear portion provided at the outer circumference of the semiconductor wafer 1. In this way, in a case where the semiconductor wafer 1 has an orientation flat, the interconnect layer 11 is formed over a way from the center to around the orientation flat of the semiconductor wafer 1.

Herein, described is an example of joining semiconductor wafers using a direction bonding method which is performed in order to manufacture a three-dimensional semiconductor module. However, the present invention is not limited to an embodiment described below.

Figure 3:
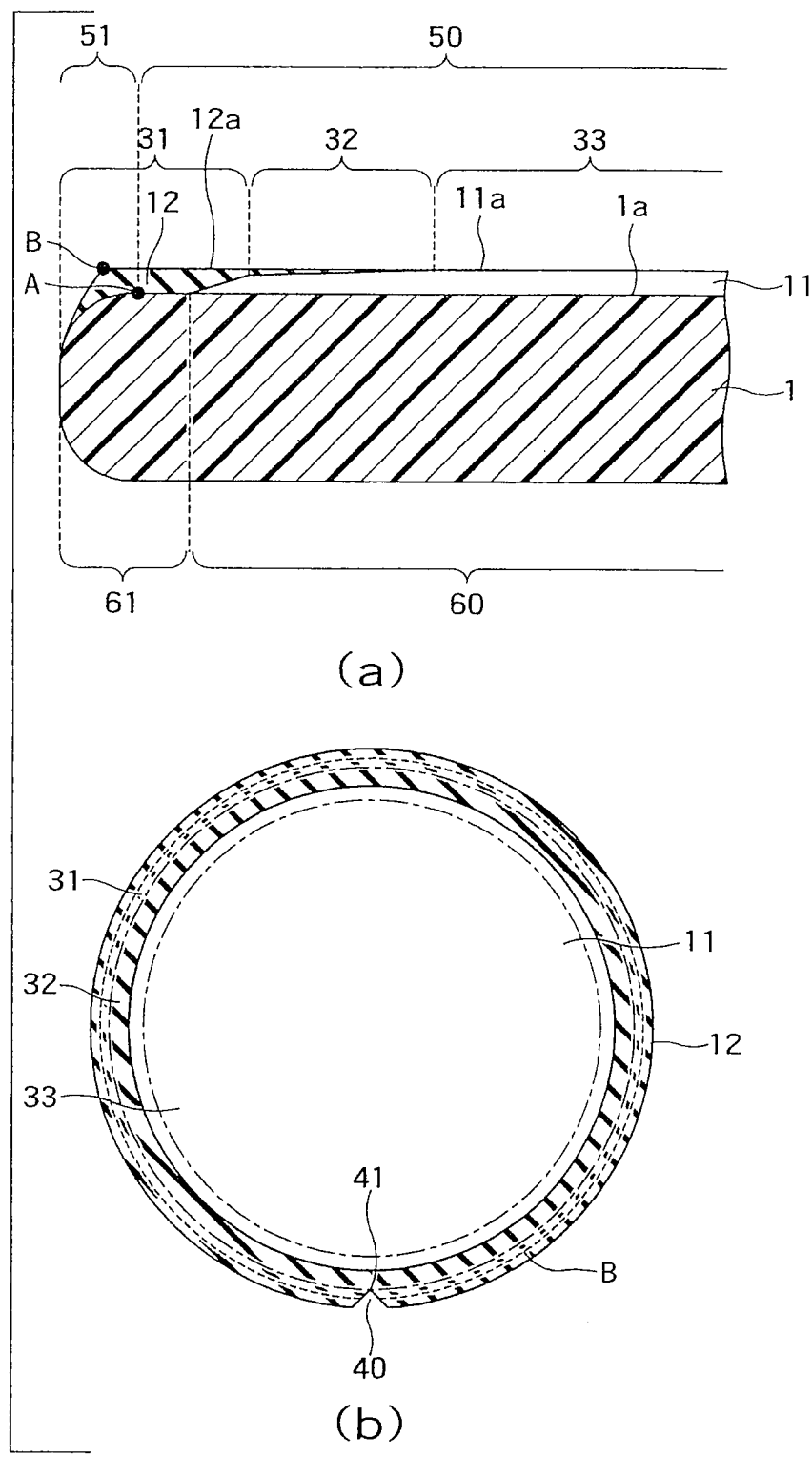
Figure 4:
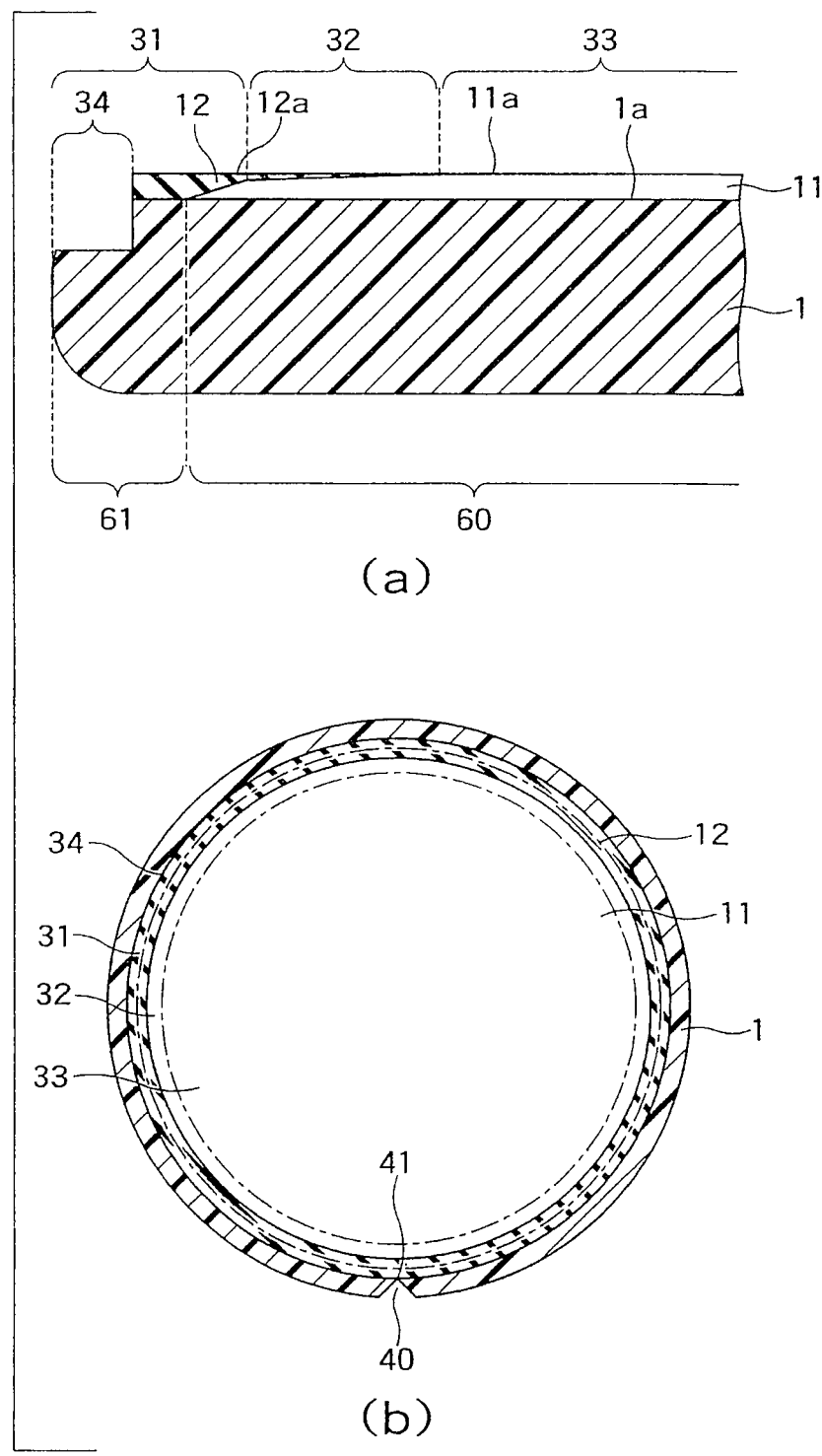
Figure 5:
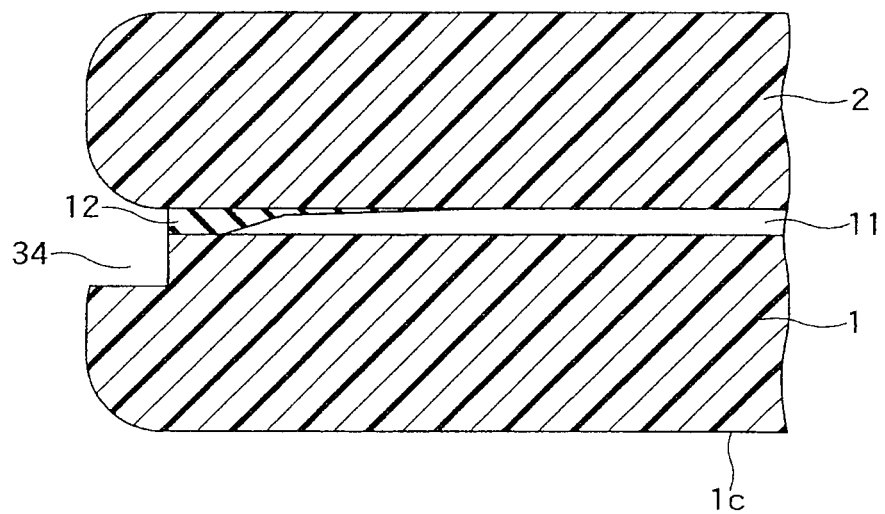
Figure 6:
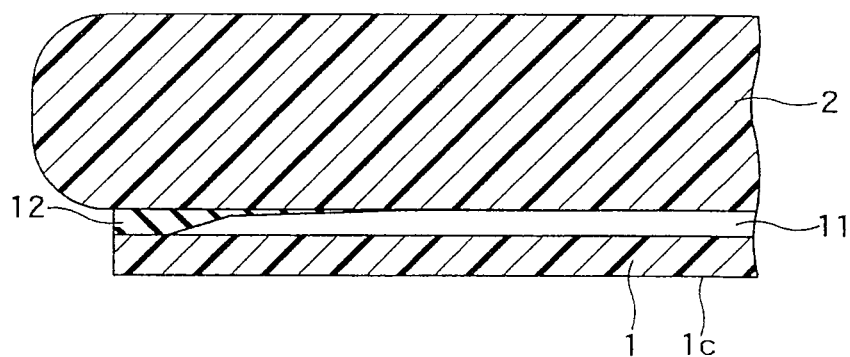

FIGS. 1 to FIG. 6 are diagrams illustrating a manufacturing method according to this embodiment. In detail, FIGS. 1 (a), 2 (a), 3 (a), and 4 (a) are cross-sectional views illustrating an outer periphery portion of a semiconductor wafer 1. Each of FIGS. 1 (b), 2 (b), 3 (b), and 4 (b) is a top view of the semiconductor wafer 1, and FIGS. 5 to 6 are cross-sectional views illustrating the outer periphery portion of the semiconductor wafer 1.

First, as illustrated in FIGS. 1 (a) and 1 (b), the semiconductor wafer 1 with the above-described interconnect layer 11 formed thereon is prepared. The interconnect layer 11 has a substantially circular shape. The interconnect layer 11 is formed on the semiconductor wafer 1 within the center portion 50 but not formed within the periphery portion present outside the center portion 50.

Figure 2:
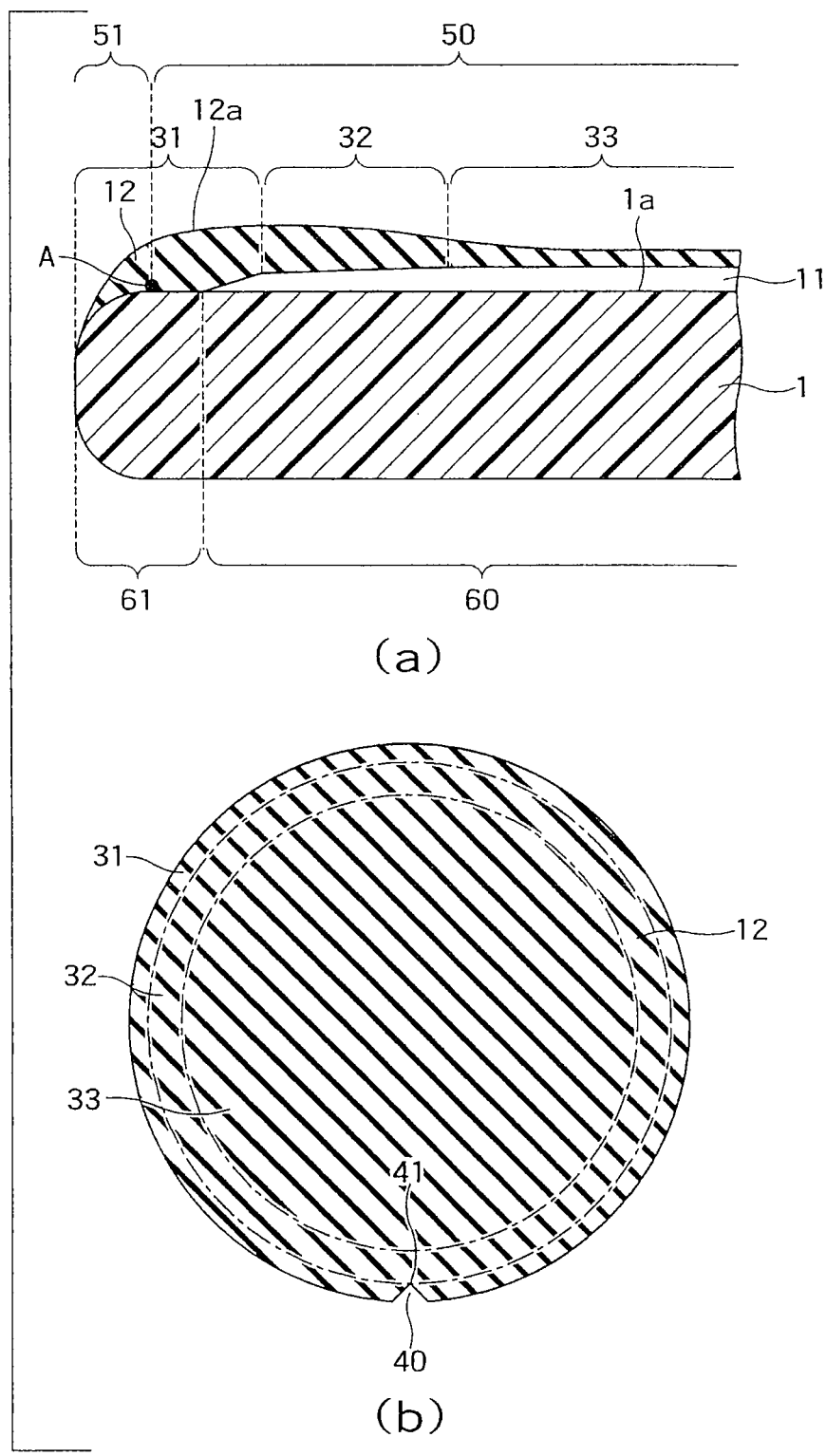

Next, as illustrated in FIGS. 2 (a) and 2 (b), an insulating film 12 formed of an oxide material such as silicon oxide or a nitride material such as silicon nitride is formed on the semiconductor wafer 1 so as to cover both the interconnect layer 11 and the outer periphery portion 51 of the semiconductor wafer 1. Examples of a method of forming the insulating film 12 include a coating method such as Spin On Glass (SOG), a deposition method such as Chemical Vapor Deposition (CVD), and a sputtering method. The method of forming the insulating film 12 may not be specifically limited but any known method may be used. In this case, in an edge cut region 31 and an interconnect layer gradual thickness decreasing region 32 of FIG. 2 (a), the sum of the thicknesses of the interconnect layer 11 and the insulating film 12 is preferably greater than the thickness of the interconnect layer 11 in an interconnect layer constant-thickness region 33. As to the height of the upper surface 12a of the insulating film 12 measured from the upper surface 1a of the semiconductor wafer 1, the height is greater at a portion in the interconnect layer gradual thickness decreasing region 32 and the edge cut region 31 than at a portion in the interconnect layer constant-thickness region 33. Subsequently, the upper surface 12a of the insulating film 12 is planarized using a Chemical Mechanical Polishing (CMP) method to have a constant height. However, since the CMP tends to perform polishing conforming to the topology of the surface, when the insulating film 12 is formed in the way described above, it is easy to planarize the upper surface 12a of the insulating film 12. As illustrated in FIG. 2 (b), the insulating film 12 is formed over a way up to the outer side than the tip 41 of a notch 40. In a case where the semiconductor wafer 1 has an orientation flat, at portions of the outer periphery portion of the semiconductor wafer 1 where no orientation flats are provided, the insulating film 12 is formed over a way up to the outer side than the orientation flat, that is, the insulating film 12 is formed over a way up to a position farther from the center of the semiconductor wafer 1 than the orientation flat.

Subsequently, the upper surface 12a of the insulating film 12 is polished using a polishing method such as CMP so as to obtain the planarized upper surface 12a of the insulating film 12 as illustrated in FIGS. 3 (a) and 3 (b). By performing this planarizing process, the upper surface 12a of the insulating film 12 located within a portion of the edge cut region 31 except for an outer periphery portion of the edge cut region 31, and the upper surface 12a of the insulating film 12 or the upper surface 11a of the interconnect layer 11 located within the interconnect layer gradual thickness decreasing region 32 and the interconnect layer constant-thickness region 33 form a continuous flat surface together and this continuous whole surface has the substantially equal height. The expression "substantially equal" means not only a case where the heights measured from the upper surface 1a of the semiconductor wafer 1 are the same all over the entire area in terms of mathematics but also includes a case where there is a height variation of several nanometers (nm) that is allowed for the subsequent processes or products when taking a slight inclination during the polishing into consideration. In other words, the upper surface 12a of the insulating film 12 located within a portion of the edge cut region 31 except for an outer periphery portion of the edge cut region 31, and the upper surface 12a of the insulating film 12 or the upper surface 11a of the interconnect layer 11 located within the interconnect layer gradual thickness decreasing region 32 and the interconnect layer constant-thickness region 33 substantially flush with each other. Further, as illustrated in FIG. 3 (a), the upper surface 12a of the insulating film 12 formed at the outermost periphery of the edge cut region 31 may not has the substantial same height.

To be specific, as illustrated in a cross-sectional view of FIG. 3 (a), an end portion B of a region where the upper surface 12a of the insulating film 12 is substantially flat is disposed on the outer side of the semiconductor wafer 1 than a position A which is an ending point of a flat portion of the upper surface 1a of the semiconductor wafer 1 and from which the upper surface 1a of the semiconductor wafer 1 starts to curve. In FIG. 3 (b), the position of the end portion B is indicated by a dotted line which is the closest line to the outer circumference of the semiconductor wafer 1. As illustrated in FIG. 3 (b), a region where the upper surface 12a of the insulating film 12 is flat is formed on the outer of the semiconductor wafer 1 than the tip 41 of the notch 40, but the position of such a region is not limited thereto. The region where the upper surface 12a of the insulating film 12 is flat may end at a position on the inner side (on the side of the center portion of the semiconductor wafer 1) than the tip 41 of the notch 40. In a case where the semiconductor wafer 1 has an orientation flat, the region where the upper surface 12a of the insulating film 12 is substantially flat may be formed to extend up to the orientation flat. Alternatively, the region where the upper surface 12a of the insulating film 12 is substantially flat may end at a position on the inner side (on the side of the center portion of the semiconductor wafer 1) than the orientation flat.

In this way, comparing with FIG. 1 (a) which illustrates a state in which the insulating film 12 is not formed, in FIG. 3 (a), the insulating film 12 is provided. Accordingly, the uppermost surface (upper surface 12a of the insulating film 12 or the upper surface 11a of the interconnect layer 11) which is the highest surface within the interconnect layer gradual thickness decreasing region 32 is substantially flat, and the upper surface 12a of the insulating film 12 located within a portion of the edge cut region 31 except for a portion near the outermost periphery of the edge cut region 31 is also substantially flat. Therefore, the upper surface 12a of the insulating film 12 located within a portion of the edge cut region 31 expect for a portion near the outer periphery of the edge cut region 31, and the upper surface 12a of the insulating film 12 or the upper surface 11a of the interconnect layer 11 located within the interconnect layer gradual thickness decreasing region 32 and the interconnect layer constant-thickness region 33 form a continuous flat surface, and the heights of the whole surface are substantially equal.

Figure 7:
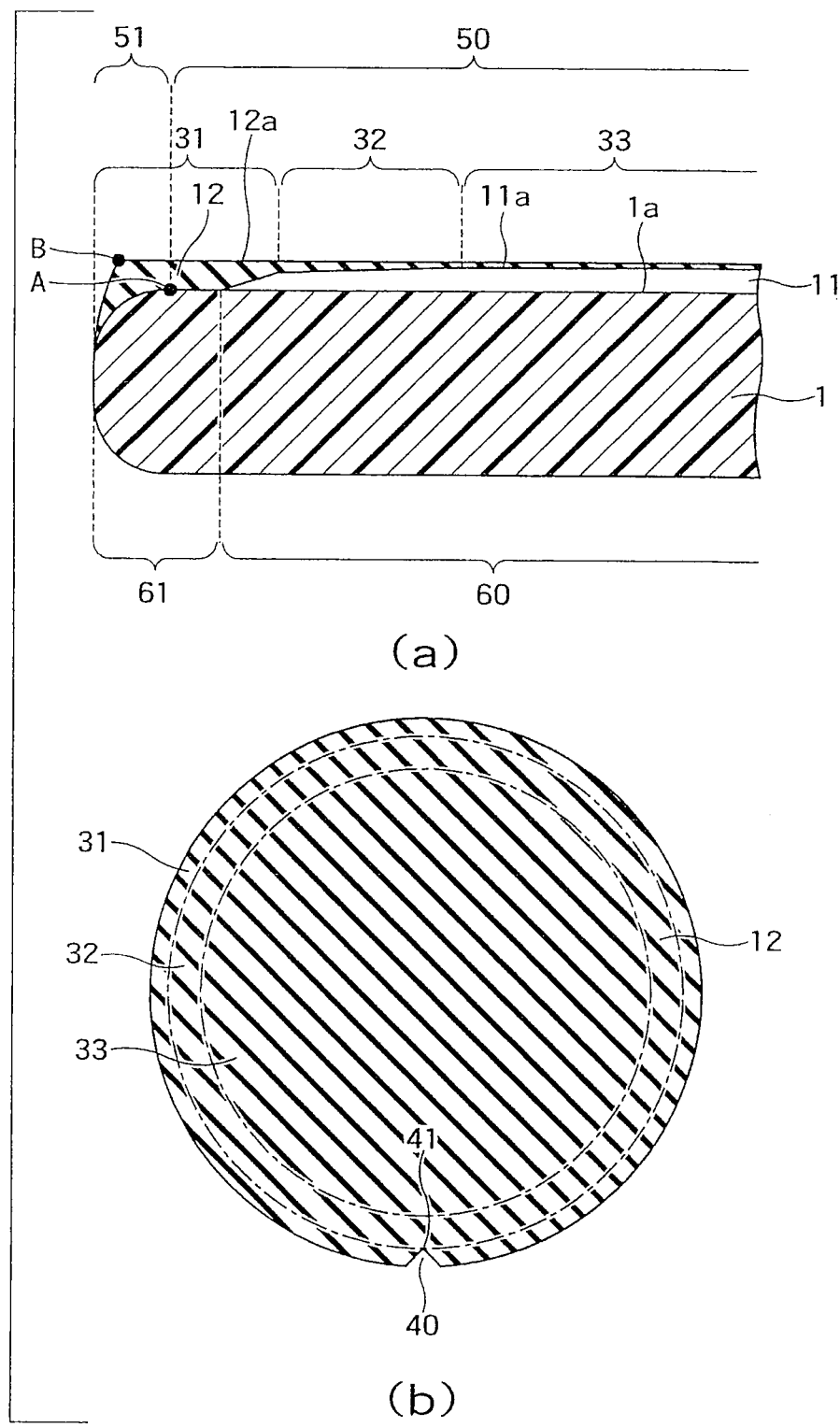
FIGS. 7 (a) and 7 (b) are diagrams for describing a first modification of the method of manufacturing a semiconductor device according to the embodiment.

Referring to FIGS. 3 (a) and 3 (b), the insulating film 12 located within the interconnect layer constant-thickness region 33 are removed through polishing, so that the insulating film 12 covers the edge cut region 31 and partially or entirely covers the interconnect layer gradual thickness decreasing region 32. In other words, the insulating film 12 covers an outer periphery portion of the fourth region 60 in which the interconnect layer 11 is formed, and covers the first region 61 in which the interconnect layer 11 is not formed. However, the present invention is not limited thereto. As illustrated in FIGS. 7 (a) and 7 (b) which illustrate a first modification of the present embodiment, the insulating film 12 located within the interconnect layer constant-thickness region 33 may remain and hence the insulating film 12 may cover the entire surface of the semiconductor wafer 1. That is, similarly to the embodiment described above, the upper surface 12a of the insulating film 12 located within a portion of the edge cut region 31, except for an outer periphery portion of the edge cut region 31, and the upper surface 12a of the insulating film 12 located within the interconnect layer gradual thickness decreasing region 32 and the interconnect layer constant-thickness region 33 form a continuous flat surface, and this surface may be substantially equal in height all over the entire area. Here, as described above, the expression "substantially equal" not only means the same height in terms of mathematics but also includes a case where there is a height variation of several nanometers (nm) that is allowed for manufacturing processes or products. As illustrated in FIG. 7 (a), the height of the upper surface 12a of the insulating film 12 formed at the outermost periphery of the edge cut region 31 may not be equal to that in other portions.

Next, as illustrated in FIGS. 4 (a) and 4 (b), a step forming process employing polishing, cutting with a dicer, or etching is performed with respect to the outermost periphery portion of the outer periphery portion 51 of the semiconductor wafer 1 so as to produce a step region 34. As illustrated in FIG. 4 (b), the step formed through such processing is provided on the inner side than the tip 41 of the notch 40. On one hand, in a case where the semiconductor wafer 1 has an orientation flat, the step formed through such processing is provided on the inner side (on the side of the center portion of the semiconductor wafer 1) than the orientation flat. The step formed through such processing is described below in greater detail.

As illustrated in FIG. 5, the semiconductor wafer 1 and a counter semiconductor wafer 2 are directly joined to produce a laminate structure. Specifically, the counter semiconductor wafer 2 is stacked on the interconnect layer 11 of the semiconductor wafer 1. As a joining method for joining the semiconductor wafer 1 with the counter semiconductor wafer 2, a room temperature direct bonding method which involves a technique of hydroxyl bond or plasma activation is used. There are other bonding methods such as a resin bonding method using a resin material. However, since a resin material suffers a problem of poor heat resistance, the resin bonding method is not preferable in terms of heat resistance and positional precision of the bonding position. Accordingly, the direct bonding method is used.

Next, the thickness of the laminate structure of the semiconductor wafer 1 and the counter semiconductor wafer 2 that are joined together is reduced. Specifically, as illustrated in FIG. 6, the back surface 1c of the semiconductor wafer 1 is ground or polished.

Here, referring to comparative examples, the reason why the step region 34 is formed is described. The comparative examples are methods of joining semiconductor wafers using a direct bonding technique that the present inventor has used from the past.

Figure 9:
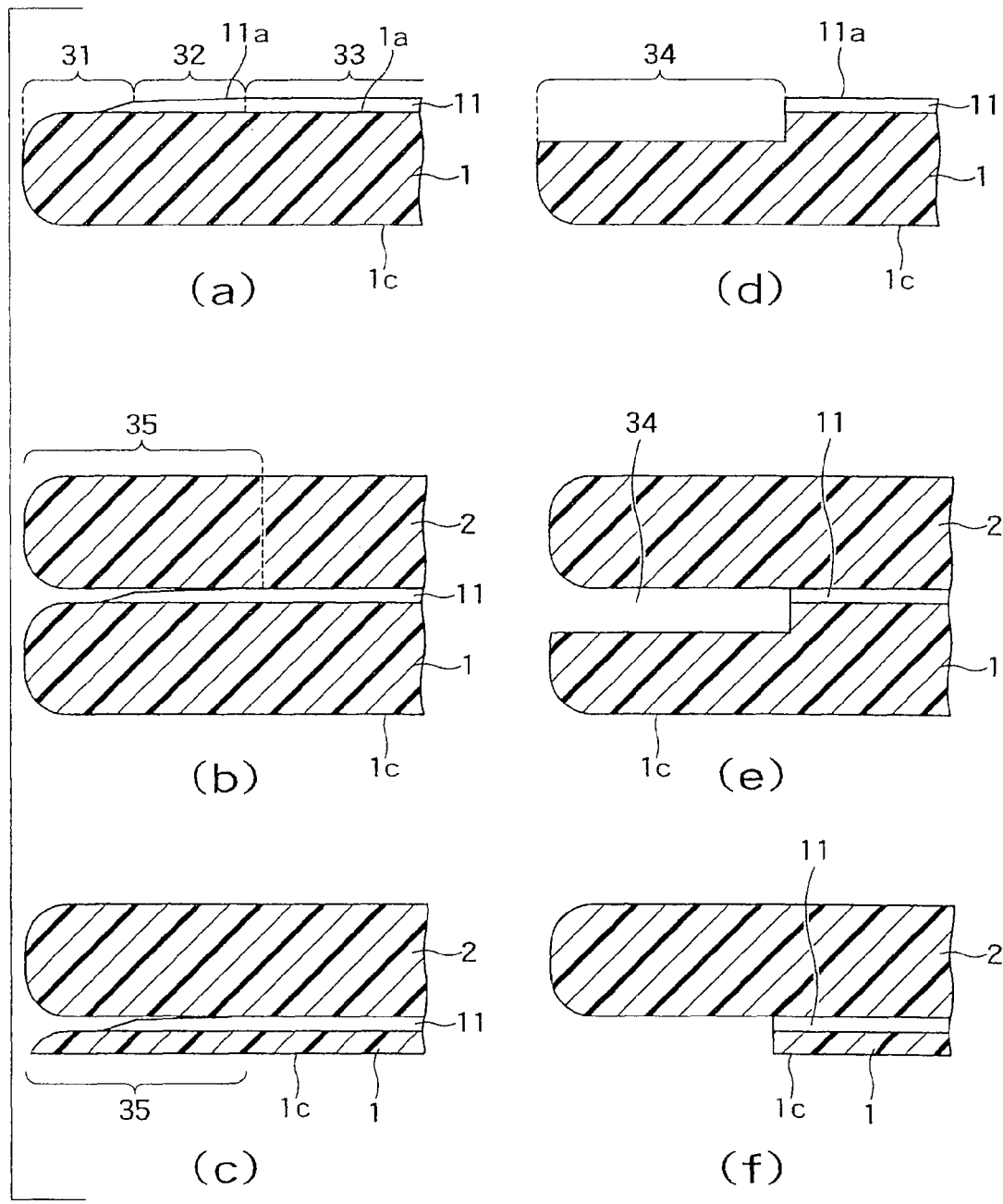
FIGS. 9 (a) to 9 (f) are diagrams for describing a method of manufacturing a semiconductor device according to a comparative example.

First, a first comparative example is described with reference to FIG. 9. FIG. 9 is a cross-sectional view illustrating a portion of a semiconductor wafer 1 located on the outer periphery side of the semiconductor wafer 1.

In this comparative example, as illustrated in FIG. 9 (a), an insulating film 12 is not formed on the semiconductor wafer 1. Therefore, the height of the upper surface 11a of an interconnect layer 11 is not constant unlike the embodiment described above. Specifically, the height of the upper surface 11a of the interconnect layer 11 within an interconnect layer constant-thickness region 33 is different from the height of the upper surface 11a of the interconnect layer 11 within an edge cut region 31 and an interconnect layer gradual thickness decreasing region 32.

In the subsequent process, as illustrated in FIG. 9 (b), if the semiconductor wafer 1 of the comparative example and a counter semiconductor wafer 2 are directly joined, a non-joined region 35 at which the semiconductor wafer 1 and the counter semiconductor wafer 2 are not in contact with each other exists within the interconnect layer gradual thickness decreasing region 32 and the edge cut region 31.

Subsequently, in the comparative example, as illustrated in FIG. 9 (c), the back surface 1c of the semiconductor wafer 1 is ground or polished. However, since there is a broad non-joined region 35, a problem arises in that the semiconductor wafer 1 is likely to easily break during the grinding or polishing.

Accordingly, in order to prevent the semiconductor wafer 1 from breaking, the step forming process is performed with respect to the outer periphery portion of the semiconductor wafer 1.

In the comparative example, as illustrated in FIG. 9 (d), the process such as polishing, cutting with a dicer, or etching is performed with respect to the outer periphery portion of the semiconductor wafer 1 so as to produce the step region 34. That is, the step forming process is performed with respect to a region (see FIG. 9 (b)) which corresponds to the non-joined region 35 in the comparative example.

In the subsequent process, as illustrated in FIG. 9 (e), when the semiconductor wafer 1 of the comparative example is bonded to the counter semiconductor wafer 2, thanks to the step region 34, the non-joined region 35 may not exist in the outer periphery portion of the semiconductor wafer 1.

Next, in the comparative example, as illustrated in FIG. 9 (f), the back surface 1c of the semiconductor wafer 1 is ground or polished. However, since the non-joined region 35 does not exist in the outer periphery portion of the semiconductor wafer 1, the outer periphery portion of the semiconductor wafer 1 is prevented from breaking.

According to the comparative example, the step region 34 is required to be formed to reach the inner side of the semiconductor wafer (the side of the center portion of the semiconductor wafer) 1 than the interconnect layer gradual thickness decreasing region 32. The width of the step region 34 which is practically required is, for example, several millimeters (mm). Moreover, semiconductor elements that can be normal products cannot be formed in the step region 34.

In the present embodiment, similarly to the comparative example, in order to prevent the outer periphery portion of the semiconductor wafer 1 from breaking, the step forming process is performed with respect to the outer periphery portion of the semiconductor wafer 1. However, according to the present embodiment, by the provision of the insulating film 12, the upper surface 12a of the insulating film 12 located within a portion of the edge cut region 31 except for an outer periphery portion of the edge cut region 31, and the upper surface 12a of the insulating film 12 or the upper surface 11a of the interconnect layer 11 located within the interconnect layer gradual thickness decreasing region 32 and the interconnect layer constant-thickness region 33 form a continuous flat surface, and the height of this surface is substantially equal all over the area. Accordingly, as illustrated in FIGS. 4 (a) and 4 (b), the processing width of the step forming process may be reduced compared to the comparative example (see FIG. 9 (d)).

According to the present embodiment, in the semiconductor wafer 1 including the interconnect layer 11, even in a case where the interconnect layer 11 located within the edge cut region 31 and the interconnect layer gradual thickness decreasing region 32 is thin, since the insulating film 12 is formed to compensate for such a small thickness, the upper surface 12a of the insulating film 12 located within a portion of the edge cut region 31 except for an outer periphery portion of the edge cut region 31, and the upper surface 12a of the insulating film 12 or the upper surface 11a of the interconnect layer 11 located within the interconnect layer gradual thickness decreasing region 32 and the interconnect layer constant-thickness region 33 form a continuous flat surface, and the height of the surface may be substantially equal all over the entire area. Accordingly, the non-joined region 35 which is likely to be generated when the semiconductor wafer 1 is joined through direct bonding may not be generated, and the width of the step region 34 which is a necessary region may be reduced. As a result, the cost for the step forming process may be reduced. Moreover, according to the present embodiment, the interconnect layer gradual thickness decreasing region 32 can be used as a region for forming semiconductor elements, which increases the number of obtainable semiconductor chips that can be used as normal products.

In the present embodiment, the number of semiconductor wafers 1 to be joined is not limited two, but a lot more of semiconductor wafers 1 may be joined. In the related art, in a case where a plurality of semiconductor wafers 1 are laminated, the higher position the semiconductor wafer 1 is located in, the larger width the step region 34 is required to have, for the purpose of preventing the semiconductor wafer 1 from breaking at the outer periphery portion. According to this embodiment, this structure is not required. Accordingly, a decrease in the number of obtainable semiconductor chips effective as normal products may be avoided.

Figure 8:
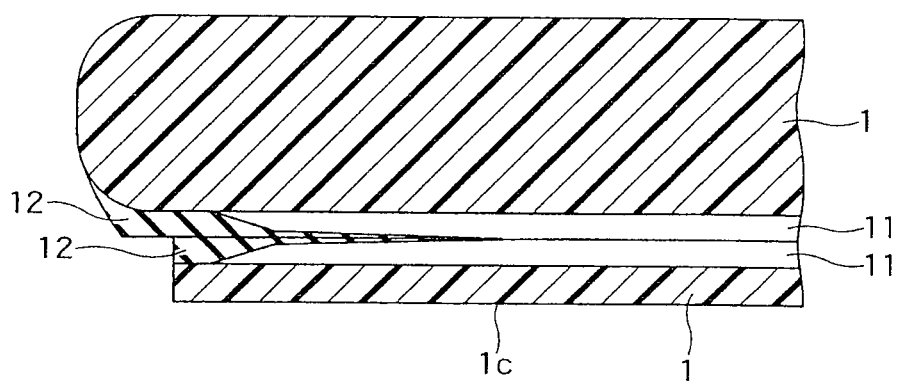
FIG. 8 is a diagram for describing a second modification of the method of manufacturing a semiconductor device according to the embodiment.

Moreover, although the semiconductor wafer 1 is joined with the counter wafer 2 in the present embodiment, the wafer with which the semiconductor wafer 1 is joined is not specifically limited. As illustrated in FIG. 8, the semiconductor wafers 1 that are processed according to the present embodiment may be joined with each other.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor wafer comprising:
a semiconductor substrate; and
an interconnect layer formed on the semiconductor substrate,
wherein the semiconductor substrate includes a first region located at an outer periphery of the semiconductor substrate and uncovered with the interconnect layer,
the interconnect layer includes a second region where an upper surface of the interconnect layer is substantially flat,
a first insulating film is formed within the first region, and
the upper surface of the interconnect layer within the second region and the upper surface of the first insulating film substantially flush with each other, wherein
the interconnect layer includes a third region located between the first region and the second region,
a height of the upper surface of the third region decreases from the second region side toward the first region side,
a second insulating film is formed on the third region,
the upper surface of the interconnect layer within the second region is substantially flush with the upper surface of the second insulating film within the third region, and
the first region includes a step region where a step is formed, on a surface on which the first insulating film is formed.

2. The semiconductor wafer of claim 1,
wherein the upper surface of the interconnect layer within the second region and the upper surface of the first insulating film are substantially equal in height.

3. The semiconductor wafer of claim 1,
wherein the upper surface of the first insulating film is substantially flat.

4. The semiconductor wafer of claim 1,
wherein the semiconductor substrate has a notch or an orientation flat, and
the first insulating film is formed to reach a more outer periphery side of the semiconductor substrate than a tip of the notch, or the orientation flat.

5. The semiconductor wafer of claim 1,
wherein the upper surface of the interconnect layer within the second region and the upper surface of the second insulating film within the third region are substantially equal in height.

6. The semiconductor wafer of claim 1,
wherein the upper surface of the second insulating film is substantially flat.

7. The semiconductor wafer of claim 1,
wherein the semiconductor substrate has a notch or an orientation flat, and
a region where the upper surface of the first insulating film is substantially flat is formed on a relatively center side compared to a tip of the notch, or the orientation flat.

8. A semiconductor wafer comprising:
a semiconductor substrate; and
an interconnect layer formed on the semiconductor substrate,
wherein the semiconductor substrate includes a first region located at an outer periphery portion of the semiconductor substrate and uncovered with the interconnect layer,
the interconnect layer includes a second region where an upper surface of the interconnect layer is substantially flat,
a third region is provided between the first region and the second region, a height of the upper surface of the interconnect layer within the third region decreases from the second region side toward the first region side,
a third insulating film is formed within the second region and the third region, and
an upper surface of the third insulating film is substantially flat, wherein
the first region includes a step region where a step is formed, on a surface on which the first insulating film of the first region is formed.

9. The semiconductor wafer of claim 8,
wherein a first insulating film is formed in the first region,
an upper surface of the first insulating film and the upper surface of the third insulating film substantially flush with each other.

10. The semiconductor wafer of claim 9,
wherein the upper surface of the first insulating film and the upper surface of the third insulating film are substantially equal in height.

11. The semiconductor wafer of claim 9,
wherein the upper surface of the first insulating film is substantially flat.

12. The semiconductor wafer of claim 9,
wherein the semiconductor substrate has a notch or an orientation flat, and
the first insulating film is formed to reach a more outer periphery side of the semiconductor substrate than a tip of the notch or the orientation flat.

13. The semiconductor wafer of claim 9,
wherein the semiconductor substrate has a notch or an orientation flat, and
a region where the upper surface of the first insulating film is substantially flat is formed to reach a more center side of the semiconductor substrate than the orientation flat or a tip portion of the notch.

* * * * *